United States Patent
Hinow et al.

(10) Patent No.: US 8,344,554 B2
(45) Date of Patent: Jan. 1, 2013

(54) SWITCHING SPARK GAP

(75) Inventors: Martin Hinow, Dresden (DE); Ralf Pietsch, Oberlichtenau (DE); Thomas Steiner, Radebeul (DE)

(73) Assignee: Maschinenfabrik Reinhausen GmbH, Regensburg (DE)

( * ) Notice: Subject to any disclaimer, the term of this patent is extended or adjusted under 35 U.S.C. 154(b) by 0 days.

(21) Appl. No.: 13/254,251

(22) PCT Filed: Jan. 12, 2010

(86) PCT No.: PCT/EP2010/000096
§ 371 (c)(1),
(2), (4) Date: Sep. 9, 2011

(87) PCT Pub. No.: WO2010/099842
PCT Pub. Date: Sep. 10, 2010

(65) Prior Publication Data
US 2011/0316433 A1 Dec. 29, 2011

(30) Foreign Application Priority Data
Mar. 6, 2009 (DE) .......................... 10 2009 012 114

(51) Int. Cl.
*H02M 3/18* (2006.01)
(52) U.S. Cl. ....................................................... 307/110
(58) Field of Classification Search ................... 307/110
See application file for complete search history.

(56) References Cited

U.S. PATENT DOCUMENTS

| | | | | |
|---|---|---|---|---|
| 2,077,773 A * | 4/1937 | Rorden et al. | ................ | 324/548 |
| 3,073,973 A * | 1/1963 | Rodewald | ..................... | 307/110 |
| 4,829,256 A * | 5/1989 | Yamagiwa et al. | ........... | 324/557 |
| 5,311,067 A * | 5/1994 | Grothaus et al. | .............. | 307/108 |
| 6,060,791 A * | 5/2000 | Goerz et al. | .................. | 307/110 |
| 6,211,683 B1 | 4/2001 | Wolf | | |
| 7,474,017 B2 * | 1/2009 | Mayes | ......................... | 307/108 |

FOREIGN PATENT DOCUMENTS

| | | |
|---|---|---|
| CH | 543746 B | 12/1973 |
| CH | 474897 B | 8/1989 |
| DE | 455933 B | 2/1928 |
| DE | 1255192 B | 6/1968 |
| DE | 1286190 A | 1/1969 |
| DE | 143130 B | 7/1980 |
| DE | 4341924 A | 6/1995 |
| FR | 1257968 B | 5/1960 |
| GB | 789348 B | 1/1958 |

* cited by examiner

*Primary Examiner* — Ronald W Leja
(74) *Attorney, Agent, or Firm* — Andrew Wilford

(57) ABSTRACT

The present invention relates to a controlled truncating radio connection for a high-voltage impulse test system, preferably for quality assurance of power transformers. According to the invention, the truncating radio connection is expanded by an additional damping unit, made of a serial damping resistance and a damping inductance having a radio connection connected in parallel thereto, and thereby combines the functionalities of a truncating radio connection and an overshoot compensation in only one auxiliary component.

2 Claims, 4 Drawing Sheets

*Fig. 1 - Prior Art*

SWITCHING SPARK GAP

CROSS REFERENCE TO RELATED APPLICATIONS

This application is the US-national stage of PCT application PCT/EP2010/000096 filed 12 Jan. 2010, published 10 Sep. 2010 as WO2010/099842, and claiming the priority of German patent application 102009012114.5 itself filed 6 Mar. 2009, whose entire disclosures are herewith incorporated by reference.

The present invention relates to a switching spark gap for a high-voltage impulse testing system, preferably for quality assurance of power transformers.

High-voltage testing has the purpose of simulating transient over-voltages in three-phase alternating current mains by means of artificially generated pulse-shaped surges. In that case, distinction is classically made between external over-voltages that are produced by, for example, a lightning strike, and internal circuit over-voltages that arise due to switching processes in the mains. The multiplicity of over-voltage phenomena are for test purposes reduced to standardized spark and switching surge voltages. For these test voltages, variables are defined that describe the rise of the voltage, the peak value and the drop back within specific tolerances. In the case of the cut-off spark surge voltage that is to simulate the effect of very rapid voltage changes, the cut-off time is added as a further variable. The requirements, forms of voltage and the determination of the parameters thereof are defined in ICE 60060-1. Depending on the respective standard test performed, the high-voltage impulse testing system comprises for that purpose a pulse generator and auxiliary components such as a cut-off spark gap, a voltage divider and an overshoot compensation.

Marx multiplier circuits, also termed Marx generators, in particular, have become established on the market in the course of time. The circuit type developed in 1923 by the inventor of the same name and granted as a patent under the number DE 455 933 is constructed in several circuit stages, wherein each of the stages comprises a series-connected surge capacitor and switching element, particularly a switching spark gap, and a resistor connected in parallel with the surge capacitor and the switching element as well as a resistor connected in series therewith. In that case, two successive stages are connected together in such a manner that can be charged in parallel and discharged in series.

The surge capacitors are charged by means of a charging direct voltage. Charging resistors that are included, in this regard not only limit the charging current, but also allow a temporary series connection of the capacitors by means of the spark gaps. The size of the spark gaps are so selected that they do not quite break down when the maximum charging current is reached.

After all the surge capacitors have been charged up to their quasistatic end value of the voltage, triggering of the lowermost spark gap takes place, which thereupon breaks down. Twice the charging voltage is now present at the next spark gap, so that this is triggered with certainty. Regardless of the number of incorporated stages, the discharging process progresses on the basis of addition of the charging voltages of previously triggered stages up to the last stage.

In this manner, surge voltage pulses of very short duration and at the same time large amplitude can be generated that are particularly suitable for test purposes and checking in high-voltage technology for proving the dielectric strength as well as interference resistance in electromagnetic compatibility.

It is also known from, for example, DE 196 39 023 [U.S. Pat. No. 6,211,683] to increase the limit load capacitance of the just-described Marx generator by an additional circuit so that during the overshoot there is achieved at the load capacitor, i.e. at the test piece, a voltage reduction that is eliminated again after decay of the overshoot. The additional circuit, also termed serial overshoot compensation, thus does not reduce the cause of the overshoot, but provides compensation for the overshoot at the load capacitance, i.e. in particular at the test piece. The overshoot compensation consists of a compensating capacitor and at least one discharging resistor or discharging spark gap connected in parallel therewith, wherein the circuit addition is to be connected in serial mode of construction with the test object into the Marx multiplier circuits. Apart from the overshoot compensation series-connected with the test object it is also known to design this in parallel-connected mode of construction with respect to the test piece. By contrast with the just-described form of construction, in the case of an overshoot compensation constructed in that manner the compensation capacitor and the at least one discharging resistor or discharging spark gap are serially arranged.

In addition, it is also necessary for simulation of an over-voltage load in terms of operation and for proving the dielectric strength of high-voltage components to act on the test objects, as already mentioned, with a cut-off surge pulse voltage. For successfully conducting a standard test of that kind it is necessary for the applied voltage to be interrupted within a tolerance of a few microseconds of the desired time elapsed since the start of the voltage wave. In technical terms this is realized by cut-off spark gaps such as have been known for a long time from the prior art, for example DD 143 130 or DE 1 255 192.

In addition, in a high-voltage impulse test system there is connected with the last stage of the Marx multiplier circuit, in addition to the test object, also a capacitively damped pulse voltage divider that reduces the spark surge voltage that is generated during discharge of the stages, to values able to be processed by the measuring and recording instruments.

All these incorporated system components of the high-voltage impulse test system have a appreciable physical size and have to be arranged in the test field at a predetermined minimum mutual spacing dependent on the voltage level. Moreover, it is necessary to adhere to similarly defined voltage-dependent minimum spacings between voltage-carrying elements and the test field boundary. The requirement of the overall high-voltage impulse test system for space is thus considerable. In addition, with many transformer manufacturers the entire high-voltage impulse test system has to be shifted in order to change the test object. In this case, the Marx generator and the three further auxiliary components have to be individually moved through the test shop and reassembled again as a high-voltage impulse test system and set up. This process is time-consuming and inconvenient to implement.

Moreover, additional capacitive loads that cannot be disregarded and that can have the consequence of non-fulfillment of the test standard, also result from the known arrangement of the high-voltage impulse test system consisting of Marx generator and the three further auxiliary components.

The object of the present invention is to reduce the physical size, which is due to the voltage, of the auxiliary components, particularly of the cut-off gap and the overshoot compensation, and thus to reduce the need for space of the overall high-voltage impulse test system so as to be able to operate the test shop more efficiently. Moreover, it is an object of the invention to reduce the capacitive loads of the test circuit by comparison with high-voltage impulse test systems known from the prior art.

This object is fulfilled by a controlled switching spark gap with the features of the first patent claim. The subclaims relate to particularly advantageous developments of the invention.

The general inventive idea in that case consists of combining the functionalities of a controlled switching spark gap and overshoot compensation in a single auxiliary component. According to the invention the controlled switching spark gap is for that purpose extended by an additional damping unit consisting of a series-connected damping resistor and damping inductor and a spark gap connected in parallel therewith. The additional damping unit is in that case connected upstream or downstream of at least one stage of the switching spark gap to form a series circuit, i.e. in serial electrical connection with at least one of the stages of the switching spark gap. The damping unit absorbs the energy of the oscillation at the voltage maximum of the spark pulse and delivers it again at the drop back thereof, whereby the effective oscillation at the voltage maximum of the spark pulse is reduced. If the switching spark gap arcs through, then it brings the voltage potential along the column to zero. The incorporated capacitors of the switching spark gap are thus quasi bridged over. In addition, the voltage potential that decays via the damping unit similarly has to be brought to zero that is produced by a short circuit, thus triggering of the spark gap arranged parallel to the serial damping resistor and damping inductor. Regardless of the respective application, the components used of the additional damping unit are exchangeable and thus cover a large parameter range of the test standards.

The following functional possibilities of combination of the switching spark gap with additional damping unit arise for the individual standard tests:

The additional damping unit is connected in for a shock surge pulse; the switching spark gap according to the invention functions as an overshoot compensation.

The damping unit is bridged over for a cut-off spark surge pulse and is thus ineffective, since due to the short pulse duration there is no need for damping by the overshoot compensation. The pulse can be cut-off after the predetermined time period by the switching spark gap.

The switching spark gap with additional damping unit can be removed from the test circuit for the standard test of switching surge pulses, since the functionalities thereof are not required for a test of that kind.

In the past, according to the prior art the switching spark gap and overshoot compensation were operated as separate components and had to be disposed at a defined spacing from one another in the test field. Through the functional integration in accordance with the invention of the switching spark gap and the overshoot compensation into a single auxiliary component it is possible for the first time for the test field operator to reduce the number of auxiliary components required and thus to optimize the space requirement of the entire test field. The test field can thus be operated more effectively. In addition, the switching spark gap according to the invention with additional damping unit has the result of a smaller capacitive load in the test circuit than the separate auxiliary components of the prior art. Due to the fact that the operator of the installation now has to acquire a functionally extended auxiliary component and by this can dispense with the high costs of the additional capacitors of the otherwise separate overshoot compensation, a substantial cost saving in production is to be expected with the device according to the invention.

According to a preferred form of embodiment of the invention the series circuit of the damping unit, consisting of damping resistor and damping inductor, is extended by an additional damping capacitor, which has the effect of homogenization of the voltage division along the capacitors of the switching spark gap.

According to a further preferred form of embodiment of the invention the switching spark gap according to the invention with additional damping unit and a further auxiliary component, particularly a voltage divider, is arranged at a common base frame with only a single head electrode for both auxiliary components. It is thus possible to physically bring together the intrinsically separate auxiliary components and to move them at a single common base frame in particularly simple manner into the test shop.

The invention will be explained in more detail in the following by way of example with reference to drawings, in which:

DETAILED DESCRIPTION

Figure 1:
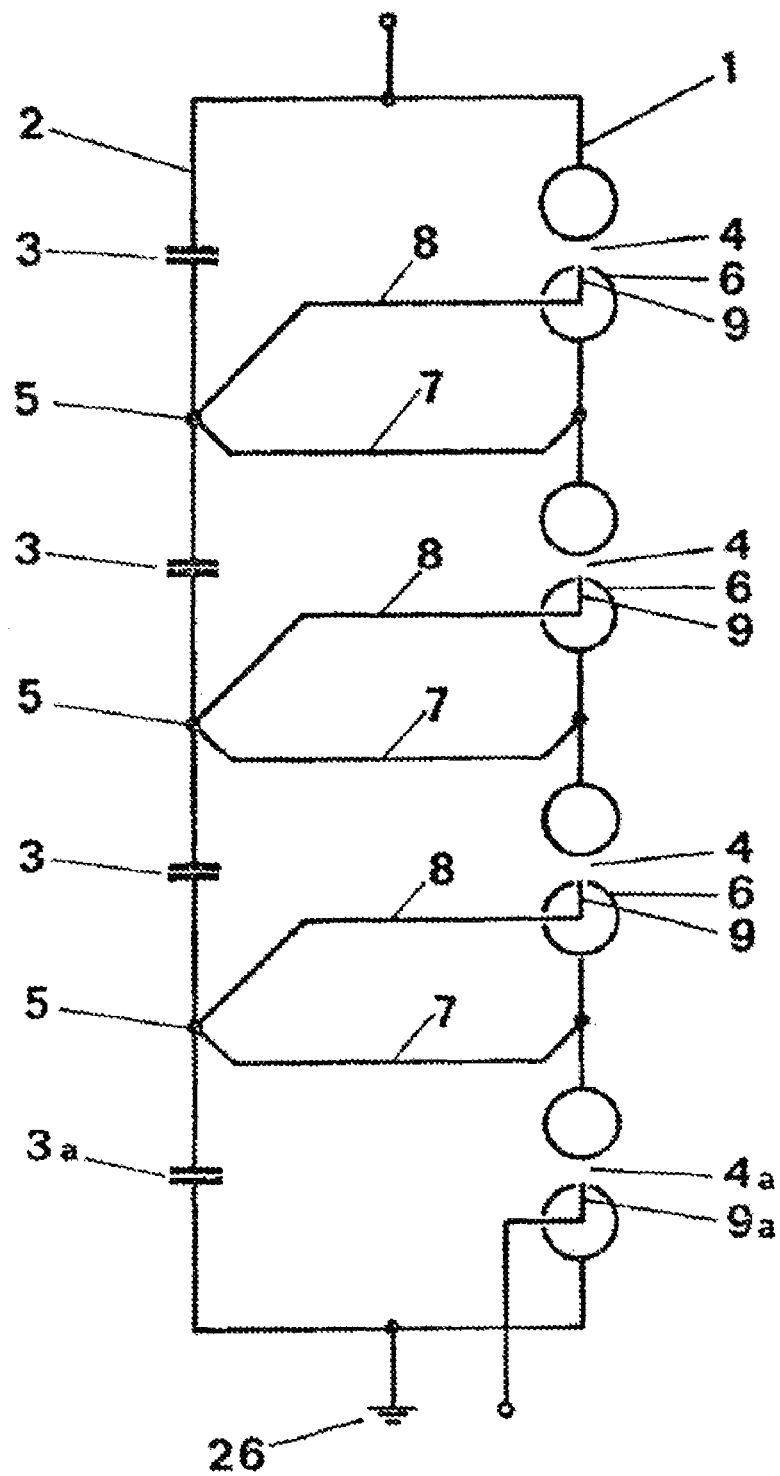
FIG. 1 shows the circuit diagram of a switching spark gap known from the prior art.

A circuit diagram that has become known from DD 143 130, of a controlled switching spark gap is shown in FIG. 1. This describes in principle the control of a switching spark gap 1 by a capacitive voltage divider 2. The entire arrangement is in the vicinity of a test piece that is not illustrated here in more detail, parallel a high-voltage test generator. The test voltage to be cut off is divided up uniformly—in correspondence with the capacitors selected to be of the same size—to the capacitors 3 of the voltage divider 2 and thus also to each individual spark gap 4 of the switching spark gap 1. The intermediate potentials at the individual capacitor connections 5 of the capacitive voltage divider 2 are connected with a main electrode 6 of the associated individual spark gap 4 by cross connections 7 for control of potential. A second connection to the same individual spark gap 4 is effected by a circuit line 8 with an auxiliary electrode 9 that is inserted into the main electrode 6 for triggering the individual spark gap 4.

The triggering of the switching spark gap 1 takes place in that the lowermost individual spark gap 4a closest to ground is externally fired in usual manner with the help of a trigger pulse applied to the auxiliary electrode 9a, so that the capacitor 3a of this first stage discharges by way of the individual spark gap 4a. The discharging current in that case also flows through the cross connection 7. This has on the one hand the consequence of a self-induction voltage in the cross connection 7 and on the other hand produces in the circuit line 8 that runs at a sufficiently large spacing, a counter-induction voltage that, however, is smaller than the voltage in the cross connection 7. Since both the cross connection 7 and the circuit line 8 have a common connecting point at the capacitor connection 5, the voltage difference leads to break down at the associated individual spark gap 4 between the auxiliary electrode 9 and the main electrode 6 and thus to a triggering of this individual spark gap 4. Arcing through of the further stages and thus of the entire switching spark gap 1 takes place in analogous manner.

Figure 2:
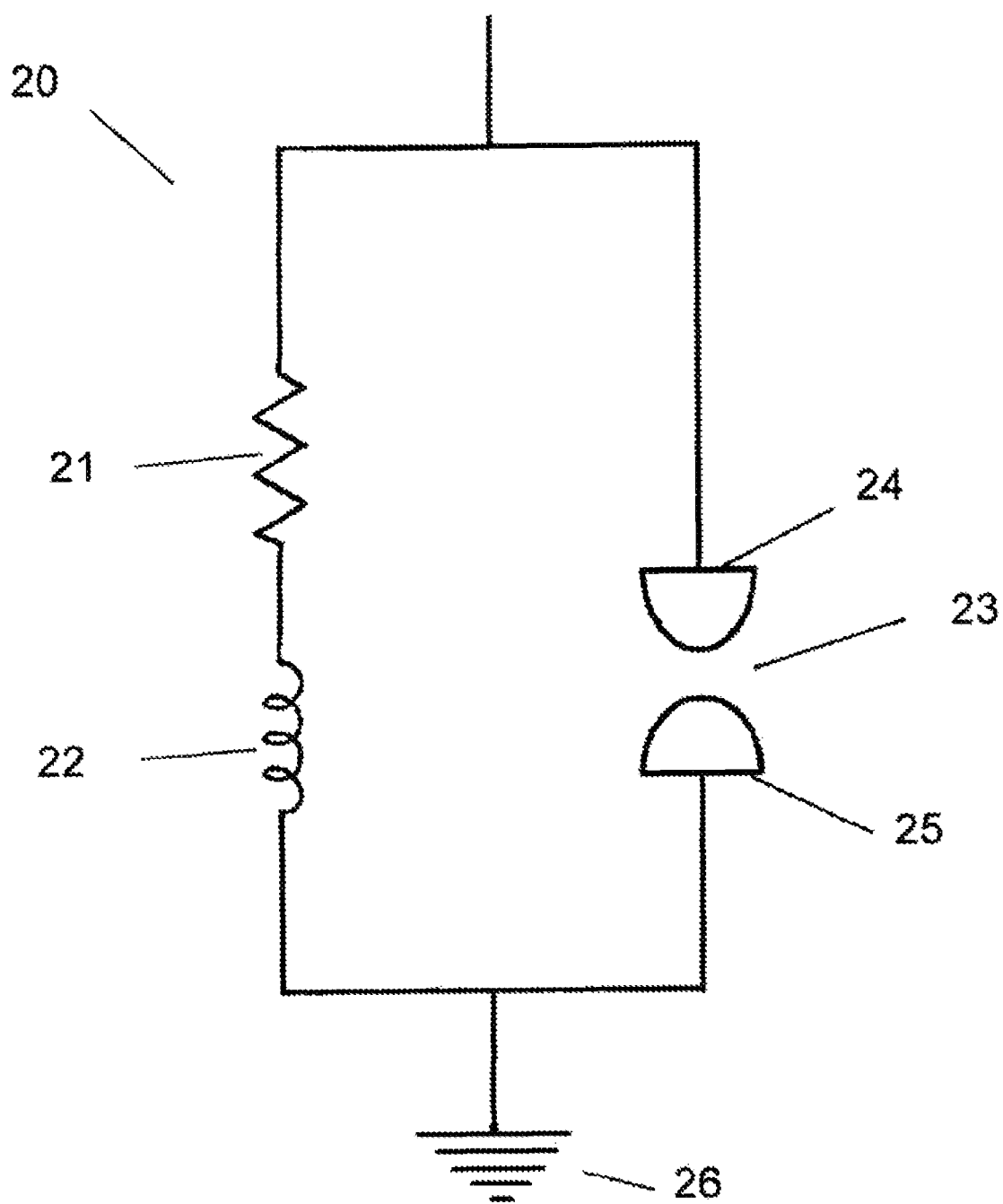
FIG. 2 shows the circuit diagram of a damping unit according to the invention.

FIG. 2 shows the damping unit 20, consisting of a serial compensating resistor 21 and compensating inductor 22 and a spark gap 23 that is connected in parallel therewith and that is formed from two opposite domes 24 and 25. The additional damping unit 20 is in that case connected upstream or downstream of at least one stage of the switching spark gap 1 to form a series circuit, i.e. serially electrically connected with at least one of the stages of the switching spark gap 1. If the damping unit 20 is arranged at the first stage of the switching spark gap 1, the ground 26 that is otherwise present there has to be connected to the additional damping unit 20. Moreover, the electrical dimensioning of the individual components can be adapted to the external basic conditions by simple exchange.

Figure 3:
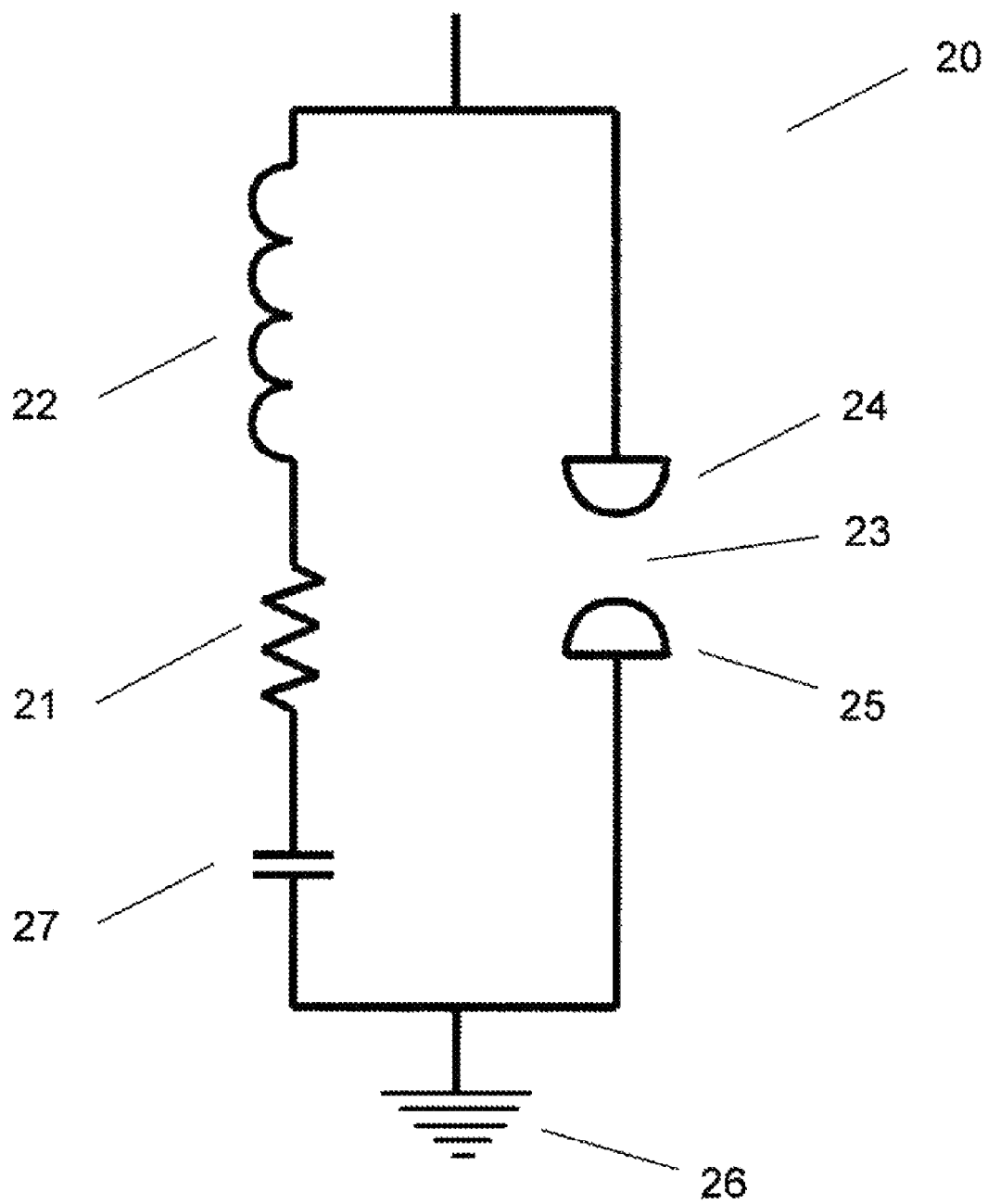
FIG. 3 shows the circuit diagram of a preferred form of embodiment of an damping unit according to the invention.

By contrast with FIG. 2, the damping unit 20 illustrated in FIG. 3 comprises a damping capacitor 27 that is also connected in series with the damping resistor 21 and the damping inductor 22 and that produces homogenization of the voltage division along the capacitors 3 of the switching spark gap 1.

Figure 4:
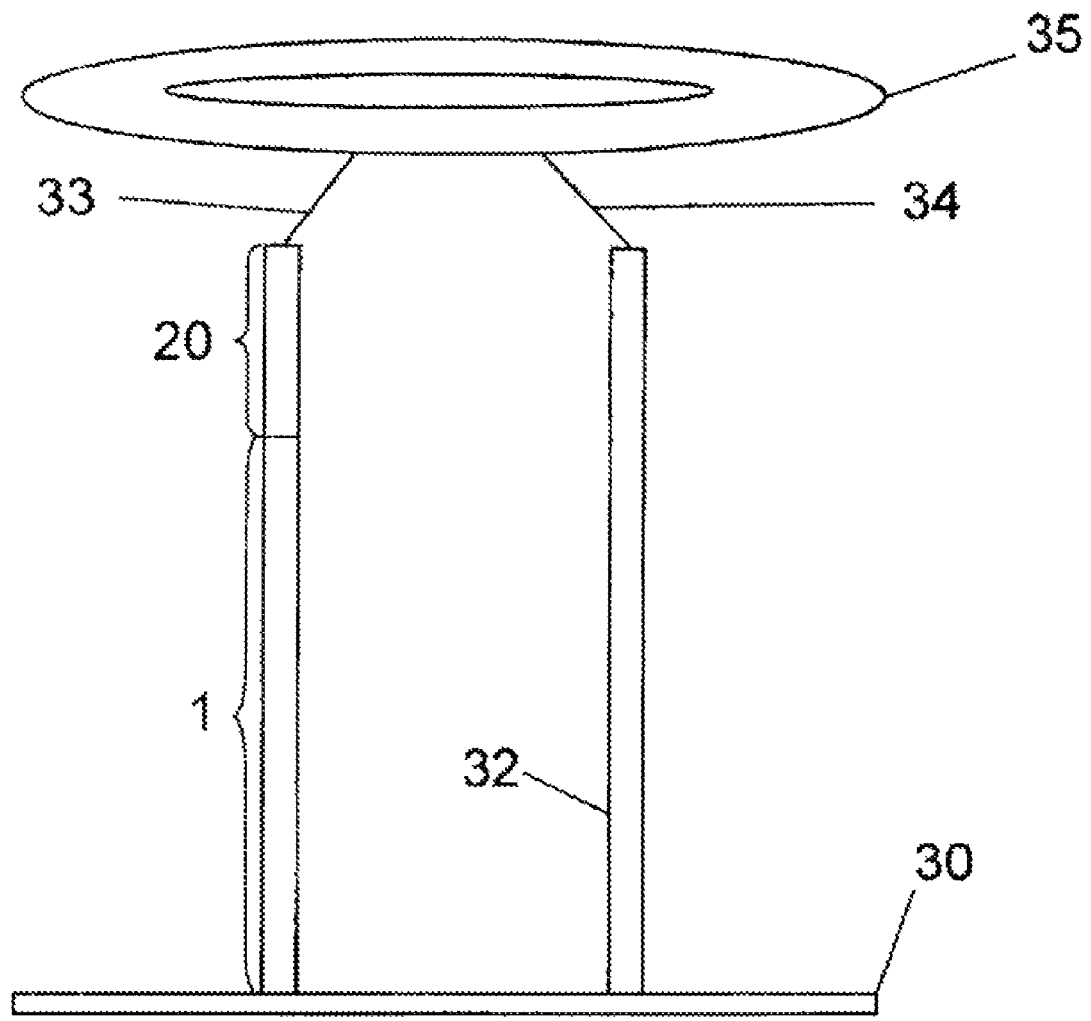
FIG. 4 shows a preferred form of embodiment of a switching spark gap according to the invention with an additional damping unit.

FIG. 4 shows a preferred embodiment of the invention in which the switching spark gap 1 according to the invention with additional damping unit 20 is arranged together with a further auxiliary component, namely the voltage divider 32, on a common base frame 30 with only a single head electrode 35 for the two auxiliary components. The two auxiliary components are again illustrated in FIG. 4 only schematically for reasons of clarity. The base frame 30 is in that case formed from a frame construction that is, for example, elongate, thus of linear construction, and provided with additional laterally fastened arms. The auxiliary components are attached to this frame 30 and conductively connected therewith. In addition, the upper ends of the corresponding auxiliary components are mechanically fixed by means of electrically conductive transverse struts 33 and 34. Connected in turn with the transverse struts 33 and 34 is the head electrode 35 that, for example, can be constructed as a toroid. The conductive transverse struts 33 and 34 thus fulfil the task not only of mechanically retaining the head electrode 35, but also of creating a potential equalization between the auxiliary components and the head electrode 35. In addition, the auxiliary components are electrically interconnected by way of a common connecting point in the region of the conductive transverse struts 33 and 34 and thus have the same voltage level in this region.

The invention claimed is:

1. A controlled switching spark gap comprising:
   a common base frame;
   a plurality of series-connected stages carried on the base frame and each having
      an individual spark gap,
      a resistor for potential control connected in parallel to the respective individual gap, and
      respective capacitors connected in parallel with the individual spark gaps;
   a respective auxiliary electrode connected to one of the individual spark gaps for external triggering;
   an additional damping unit carried on the frame, upstream or downstream of and in series with one of the stages, and comprised of a series-connected compensating resistor and compensating inductor, and a spark gap connected in parallel to the compensating resistor and inductor;
   a voltage divider on the base frame; and
   a single common head electrode for the damping unit and switching spark gap on the base frame.

2. The controlled switching spark gap according to claim 1, wherein the series circuit of the damping unit consisting of compensating resistor and compensating inductor is provided with a further damping capacitor.

* * * * *